United States Patent
Confalonieri et al.

(10) Patent No.: US 9,264,060 B2
(45) Date of Patent: Feb. 16, 2016

(54) ANALOG TO DIGITAL CONVERSION METHOD WITH OFFSET TRACKING AND CORRECTION AND ANALOG TO DIGITAL CONVERTER IMPLEMENTING THE SAME

(71) Applicant: ST-Ericsson SA, Plan-les-Ouates (CH)

(72) Inventors: Pierangelo Confalonieri, Caponago (IT); Federico Guanziroli, Lentate sul Seveso (IT); Alberto Minuti, Milan (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/434,142

(22) PCT Filed: Nov. 7, 2013

(86) PCT No.: PCT/EP2013/073251
§ 371 (c)(1),
(2) Date: Apr. 8, 2015

(87) PCT Pub. No.: WO2014/072391
PCT Pub. Date: May 15, 2014

(65) Prior Publication Data
US 2015/0263755 A1     Sep. 17, 2015

Related U.S. Application Data

(60) Provisional application No. 61/756,686, filed on Jan. 25, 2013.

(30) Foreign Application Priority Data

Nov. 9, 2012 (EP) .................................... 12425180

(51) Int. Cl.
*H03M 1/16* (2006.01)
*H03M 1/46* (2006.01)
*H03M 1/10* (2006.01)

(52) U.S. Cl.
CPC ............ *H03M 1/468* (2013.01); *H03M 1/1019* (2013.01); *H03M 1/1023* (2013.01); *H03M 1/46* (2013.01)

(58) Field of Classification Search
CPC ... H03M 1/46; H03M 1/1019; H03M 1/1023; H03M 1/468; H03M 1/0607; H03M 1/12
USPC .......................................... 341/118–122, 155
See application file for complete search history.

(56) References Cited

U.S. PATENT DOCUMENTS 5,247,299 A * 9/1993 Lim .................... H03M 1/0607
                                                              341/136
5,576,708 A * 11/1996 De Wit ................ H03M 1/0607
                                                              341/118

(Continued)

FOREIGN PATENT DOCUMENTS

EP      1 887 702 A1      2/2008

OTHER PUBLICATIONS

International Search Report issued in corresponding International application No. PCT/EP2013/073251, date of mailing of report Mar. 10, 2014.

(Continued)

*Primary Examiner* — Lam T Mai
(74) *Attorney, Agent, or Firm* — Patent Portfolio Builders PLLC

(57) ABSTRACT

A new approach is disclosed concerning offset cancellation methods in analog to digital converters and analog to digital converters implementing the same. Such approach allows to efficiently cancel offset drifts in analog to digital converters.

13 Claims, 6 Drawing Sheets

(56) References Cited

U.S. PATENT DOCUMENTS

| | | | | |
|---|---|---|---|---|
| 5,606,320 | A | * | 2/1997 | Kleks ................... H03M 1/002 341/118 |
| 5,629,698 | A | | 5/1997 | De Wit |
| 6,448,911 | B1 | * | 9/2002 | Somayajula ........ H03M 1/1019 341/120 |
| 2013/0176153 | A1 | * | 7/2013 | Rachid ................... H03M 1/12 341/118 |
| 2013/0229294 | A1 | * | 9/2013 | Matsuno ............. H03M 1/0607 341/155 |

OTHER PUBLICATIONS

Confalonieri, Pierangelo et al., "A 2.7mW 1MSps 10b Analog-to-Digital Converter with Built in Reference Buffer and 1LSB Accuracy Programmable Input Ranges", Proceeding of 30th European Solid-State Circuits Conference, 2004, ESSCIRC 2004, Sep. 21-23, 2004, Leuven, Belgium, pp. 255-258.

* cited by examiner

ANALOG TO DIGITAL CONVERSION METHOD WITH OFFSET TRACKING AND CORRECTION AND ANALOG TO DIGITAL CONVERTER IMPLEMENTING THE SAME

TECHNICAL FIELD

The present disclosure relates to the field of analog to digital conversion, in particular to an analog to digital conversion method with offset tracking and correction and an ADC analog to digital converter implementing the same.

BACKGROUND ART

A prior art analog to digital converter 1 with offset correction is shown in FIG. 1. In particular, in FIG. 1 a capacitive pseudo-differential SAR (Successive Approximation Register) analog to digital converter 1 is shown, comprising a capacitive digital to analog converter C-DAC, a comparator CMP, a logic circuit SAR-LOG adapted to execute a SAR algorithm, a timing circuit TIM-SEQ adapted to provide control signals to the different components of the analog to digital converter 1 upon receipt of a signal CONVERSION REQUEST adapted to request the converter 1 to perform a new analog to digital conversion, and offset register OFF-REG adapted to store a measured or estimated digital value which is representative of the offset voltage value at the summing nodes NS+, NS−. In the example shown in FIG. 1 the summing nodes Ns+, NS− represents common nodes to which respectively first ends of a first array and a second array of switched capacitors (not shown in the figures) are connected. Such analog to digital converter is for example disclosed in the paper "*A 2.7 mW 1MSps 10b Analog-to-Digital Converter with Built in Reference Buffer and 1LSB Accuracy Programmable Input Ranges*", Confalonieri P., Zamprogno M., Girardi F., Nicollini G., Nagari A., Solid-State Circuits Conference, 2004, ESSCIRC 2004, September 2004, pp. 255-258.

A known method to cancel the offset of the analog to digital converter 1 consists in measuring it with a dedicated routine at the power-up or during testing phase, storing it as a digital value in the offset register OFF-REG and analogically subtracting the stored value from the analog input voltage $V_{IN}$ to be converted. EP 1887702 B1 discloses a switched capacitance analog to digital converter in which an estimated or measured offset can be analogically added or subtracted to an analog input signal to be converted.

FIG. 2 shows a set TIM1 of the most relevant timing logic signals that can be used during the analog to digital conversion and offset correction in the prior art analog to digital converter shown in FIG. 1. When a conversion request is issued (i.e. when the signal CONVERSIONREQUEST goes at high level), the array of switched capacitors connected to the summing node NS+ is charged between $V_{IN}$ and $V_{CM}$, while the other array of switched capacitors connected to the summing node NS− is charged between GND and $V_{CM}$, through VINCHARGE and VINSAMPLE high level signals. $V_{CM}$ represents the input common mode voltage of the comparator CMP. The signal VINSAMPLE through the MOS switches M1 and M2 is adapted to selectively force the summing nodes NS+ and NS− to the input common mode voltage $V_{CM}$. When the charging transient is over, the signal VINSAMPLE is reset by the timing sequencer TIM-SEQ, freezing the voltage to be converted. With a slight delay the timing sequencer TIM-SEQ:

- by means of the signal VINCHARGE turns off the switches of the arrays of switched capacitors that were connected to the input analog signal $V_{IN}$; and
- by means of the high level on the signal SARENABLE enables the SAR algorithm to search for the output digital code which represents the best possible digital approximation of the input analog signal $V_{IN}$. As indicated in the time diagram TIM 1 of FIG. 2, when the signal SARBUS goes at high level a first time period MSB TENT is allocated for performing the first comparison useful for resolving during the subsequent time period MSB-1 the most significant bit (MSB) of the output digital code, and the subsequent time periods MSB-1 TENT, . . . , LSB TENT are allocated for performing the subsequent comparisons and resolving the subsequent bits down to the least significant bit (LSB) of the digital output code (OUT-COD). Meanwhile, through the digital to analog converter C-DAC, a digital to analog conversion of the content of the offset register OFF-REG is done, so to cancel the offset effects from the system. As anticipated, said content is an offset digital value representing an estimation or measure of the voltage offset at said first common node NS+, NS−. Such offset can have many contributions: the offset of the comparator CMP, the mismatch between the switches M1 and M2, and an offset that could appear on different ground nodes, because of bonding inductances or resistive paths, as a result of digital switching activity just before the falling front of the signal VINSAMPLE.

The existing solutions for the offset correction are affected by several problems. In particular, if the offset correction code is stored in an OTP (One Time Programmable) memory during testing phase, this is done at a given temperature; this means that a temperature variation, as well as device degradation, gives rise to an error in offset correction, introducing an error that can be considered unacceptable. Otherwise, if the offset correction code is stored at every power-up phase (which is often not possible), device degradation would be properly corrected, as well as the temperature drift. But as soon as the temperature changes during the power-up time, before the next power-down, once again these would lead to an offset cancellation error.

The most important contribution to this offset drift is usually coming from to the comparator CMP, but also from the changes in the charge injection for switches M1 and M2 (due to their threshold voltage variations, as well as variations in electron mobility, or in the fall time of the digital signal that turn them off), or changes in the offset coming from different ground paths (due to the variations of the currents that are flowing through them just before the falling front of the signal VINSAMPLE).

Historically, a possible approach to reduce such offset drift is to connect during the analog input $V_{IN}$ sampling phase the differential outputs of the comparator CMP to the summing nodes NS+ and NS—, in order to cancel at each conversion (except for a little error due to the finite gain of the comparator) the comparator offset. This reduces the problem but it's not enough, and moreover, can imply longer sampling periods, if there is the need to guarantee an appropriate settling time with a small comparator CMP that has a restrained current consumption.

SUMMARY OF THE INVENTION

In view of the above described problems of the known solutions, it is an object of the present invention to provide improved solutions for the offset correction in an analog to digital converter. Such solutions are such to manage different kinds of offset contributions, such as for example the ones disclosed in the preceding paragraph "Background art" together with any other possible one, even if not indicated in the present specification.

According to such solutions, changing the timing table and adding a digital offset tracking and correcting block OTC-B that samples and processes the comparator output OUT-COMP signal according to the algorithms/methods disclosed in the following paragraph "Detailed specification" and in the attached drawings, it's possible to update the value of the foreseen offset digital value stored in the offset register OFF-REG, to obtain a reliable compensation of slow variations of the offset in some different ways (FIG. 3, 5, 8/time diagram TIM2 of FIG. 4, FIG. 6/time diagram TIM3 of FIG. 7). With the proposal of FIG. 8 and the time diagram TIM2 of FIG. 4 it's possible to cancel not only the offset drift, but also the total offset and its variations.

BRIEF DESCRIPTION OF THE DRAWINGS

Further features and advantages of the new solution will become more apparent from the following detailed description of exemplary but non-limiting embodiments thereof, as illustrated in the attached figures, in which.

DETAILED DESCRIPTION

In the attached figures identical or similar elements are indicated with the same reference numbers/symbols.

Figure 1:
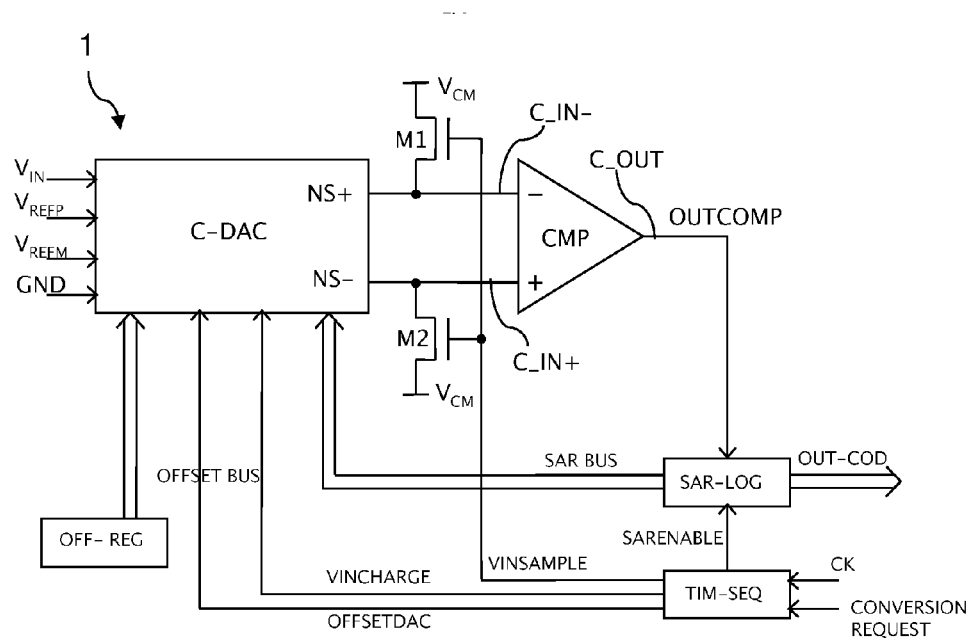
FIG. 1 shows a schematic diagram of a prior art analog to digital converter.
Figure 2:
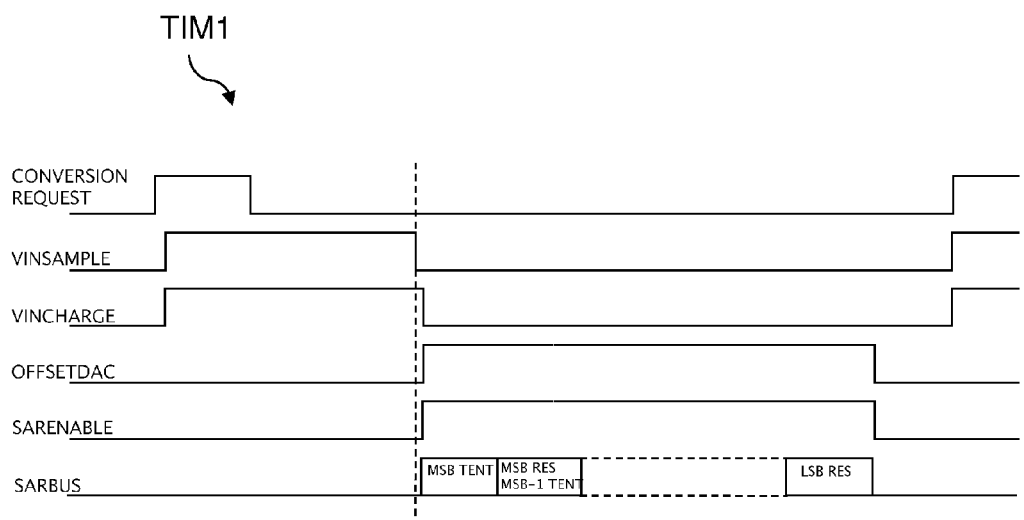
FIG. 2 shows the timing diagrams of the most relevant signals for the operation of the analog to digital converter of FIG. 1.

The solutions herein disclosed stems from these considerations: in a system like the one depicted in FIG. 1, taking for granted that digital blocks SAR-LOG, TIM_SEQ and OFF_REG do not introduce offset, assuming that all the devices are noiseless, it is possible to affirm that the system is offset-free if the comparator digital output OUTCOMP, just after M1, M2 switches turning off, doesn't take either the high level state or the low level state.

Figure 3:
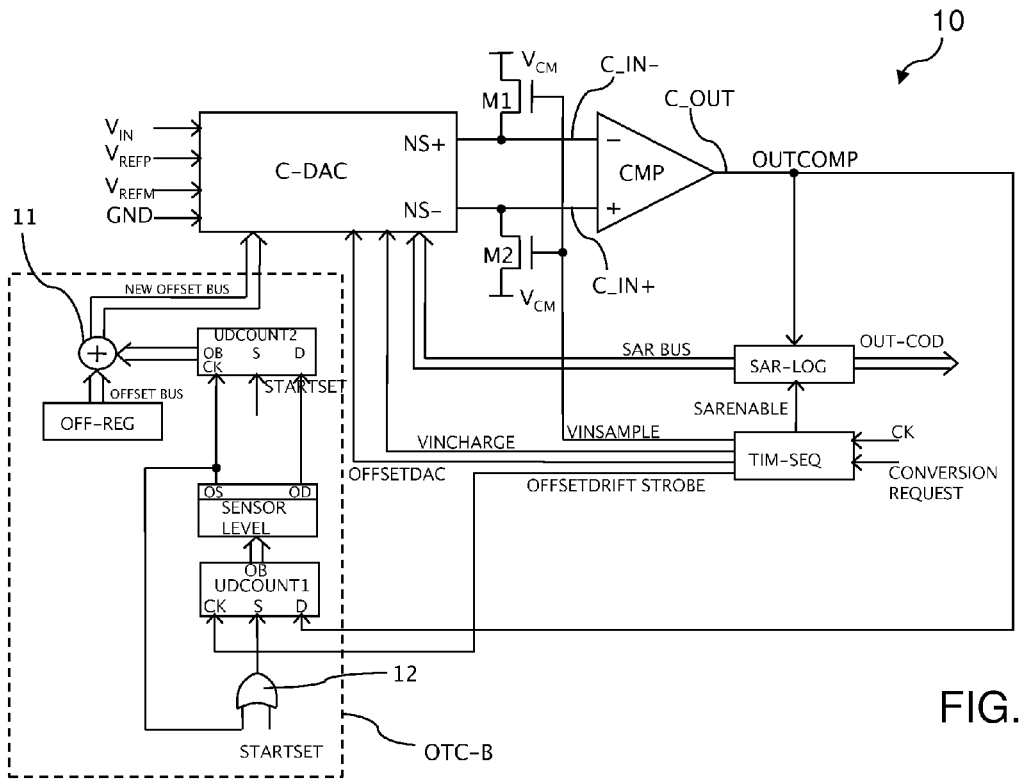
FIG. 3 shows a schematic diagram of a first embodiment of an analog to digital converter.

The analog to digital converter 10 of FIG. 3 differs from the converter of FIG. 1 for the fact that includes a digital offset tracking and correcting block OTC-B, comprising a first up/down counter UDCOUNT1, a digital comparison block SENSOR LEVEL, a second up/down counter UDCOUNT2, an offset register OFF-REG (this component is present also in the analog to digital converter of FIG. 1), a digital adder 11 and a resetting OR gate 12.

Figure 4:
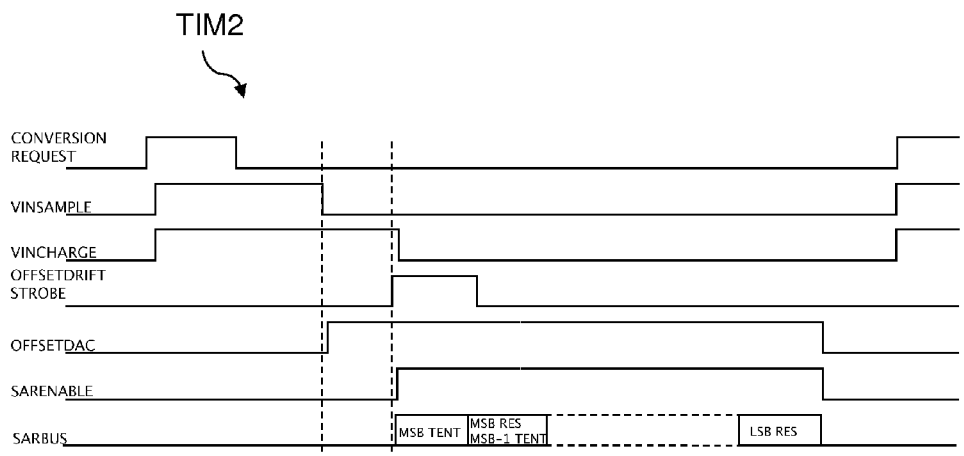
FIG. 4 shows the timing diagrams of the most relevant signals for the operation of the analog to digital converter of FIG. 3 and also for the operation of the analog to digital converters of FIGS. 5 and 8.

Following the above considerations, just after the falling front of the signal VINSAMPLE, a new interval of time is introduced (see diagram TIM2 of FIG. 4) during which, subsequent to a trigger provided by the signal indicated in FIG. 4 as "OFFSETDAC" which in the example starting from the low level state takes the high level state, the digital to analog conversion of the digital value stored in the offset register OFF-REG is performed corrected with the addition of the digital value stored in the second up/down counter UDCOUNT2, but the signal VINCHARGE is still at high level, and the whole SAR phase is postponed. This lapse of time, which lasts about a tentative period, is exploited to perform a comparison in the condition that is representative of the offset presence. The "tentative" period can be defined as the period of time needed for a SAR to resolve one bit of the output digital code. The signal OUTCOMP at the output C_OUT of the comparator CMP is then sampled at the rising front of a new signal OFFSETDRIFTSTROBE (FIG. 3), provided by the timing sequencer TIM-SEQ, that is used as a clock for the first up/down counter UDCOUNT1 comprised in the offset digital tracking and correcting block OTC-B. For example, if the level of signal OUTCOMP is 1, the up/down counter UDCOUNT1 will be increased by 1, otherwise if the level of OUTCOMP signal is 0 the up/down counter UDCOUNT1 will be subtracted by 1. The value or level of the signal OUTCOMP after the first comparison, should theoretically be the sign bit of the offset, if it wasn't for the noise that can affect that measure in an unacceptable way. Performing many comparisons in the below described mode it is possible to estimate the offset excluding the noise contribution. The size of the up/down counter UDCOUNT1, in conjunction with the operating parameters of the digital block SENSOR LEVEL, allows to tell the offset from the noise, working like a noise filter.

The above mentioned digital comparison block SENSOR LEVEL is adapted to perform a digital comparison between the content of the up/down counter UDCOUNT1 and at least one pre-established threshold value, for example close to the maximum positive or negative value of the up/down counter UDCOUNT1, or can simply be an overflow sensor (positive or negative) of its value. When the digital comparison block SENSOR LEVEL senses the level that is considered significant of the presence of offset, it generates a pulse on the signal OS that crossing the resetting OR gate 12 resets the up/down counter UDCOUNT1 at its central value. Meanwhile, OD output of the digital comparison block SENSOR LEVEL is set high or low to indicate that the reached level is a maximum or a minimum one. The output OS of the digital comparison block SENSOR LEVEL works as a clock for the second up/down counter UDCOUNT2, which acts like the register for offset variations, incrementing or decrementing it according to OD value. In the offset digital tracking and correcting block OTC-B the value stored in second up/down counter UDCOUNT2 is summed to the one stored in offset register OFF-REG to obtain an output digital signal NEWOFFSET-BUS; the D/A conversion of this signal will be exploited at every new conversion to perform a new test of the sign of the comparator CMP inside the drift research algorithm, as well as to compensate the offset for the SAR conversion just like it was done in time diagram TIM1 of FIG. 1.

To clarify, let's suppose that there is no residual offset at all; if the first up/down counter UDCOUNT1 is correctly sized from a noise point of view, it will vary its value at any given conversion just because of the noise itself, but it won't reach the pre-established threshold level set in the SENSOR LEVEL block, which would result in a null offset correction value.

The two shown up-down counters UDCOUNT1 and UDCOUNT2 are preferably set on the central code (such as 0, meaning no variation introduced on offset) by the signal STARTSET crossing the resetting OR gate 12, which could be either a power-on reset signal or the power down one, so to start from an optimal condition. But it's important to note that the system could reach anyway the solution, even starting from a different reset value, but if the reset value is not the ideal one, this could imply much more time.

Figure 5:
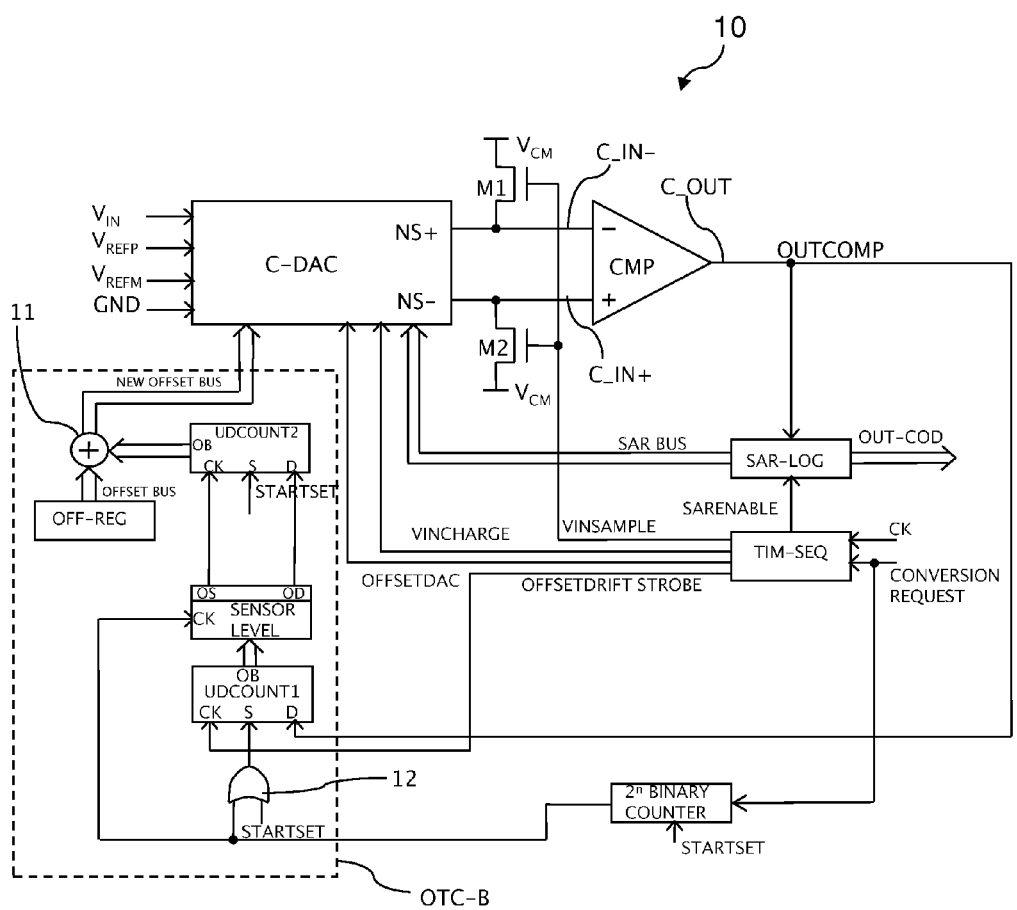
FIG. 5 shows a schematic diagram of a second embodiment of an analog to digital converter.

FIG. 5, related with timing diagram TIM2 of FIG. 4, shows a different embodiment of an analog to digital converter which basically differs from the converter of FIG. 3 for the way to manage the difference between noise and offset.

The up/down counter UDCOUNT1 is reset by a new block, 2" BINARY COUNTER, and whose output is a pulse every 2n CONVERSION REQUEST. The up/down counter UDCOUNT1 behaves like in the example of FIG. 3 and if during the counting time of 2" BINARY COUNTER block its content passes the threshold level or levels set in the SENSOR LEVEL block, the latter emits a pulse that increases or decreases the up/down counter UDCOUNT2 that is always the register containing the offset drift data, and that will be summed by the digital adder 11 to the offset digital value stored in the offset register OFF-REG. Conversely, if during the counting time 2" BINARY COUNTER block the content of the up/down register UDCOUNT2 does not exceed the threshold level or levels set in the SENSOR LEVEL block the 2" BINARY COUNTER block resets the first up/down counter UDCOUNT1 through the OR gate 12. To resume, the difference between FIG. 3 and FIG. 5 ADC methods and converters is that the first keeps on following the offset drift variations, while the second verifies them periodically; the proposed ADC methods and converters should not be considered literally, but in their general approach: for example notwithstanding digital circuit variations that lead to different ways of determining the offset value.

Figure 6:
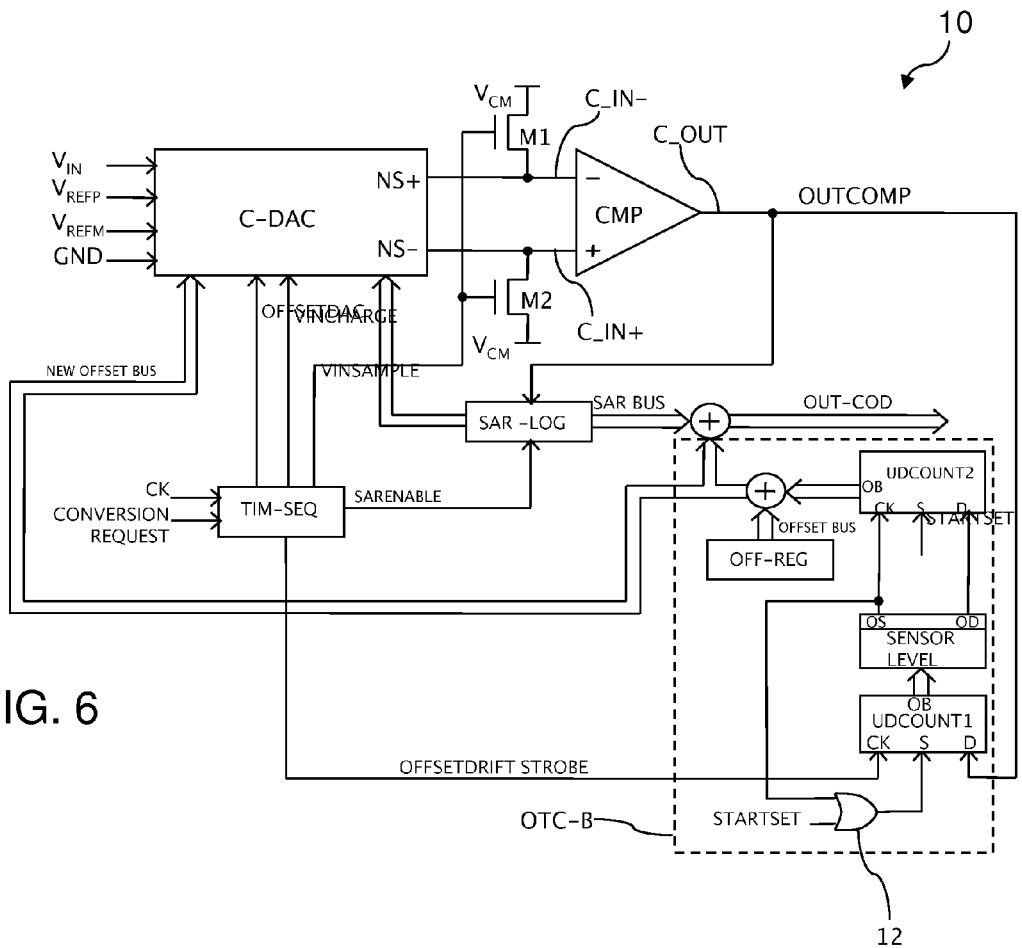
FIG. 6 shows a schematic diagram of a third embodiment of an analog to digital converter.
Figure 7:
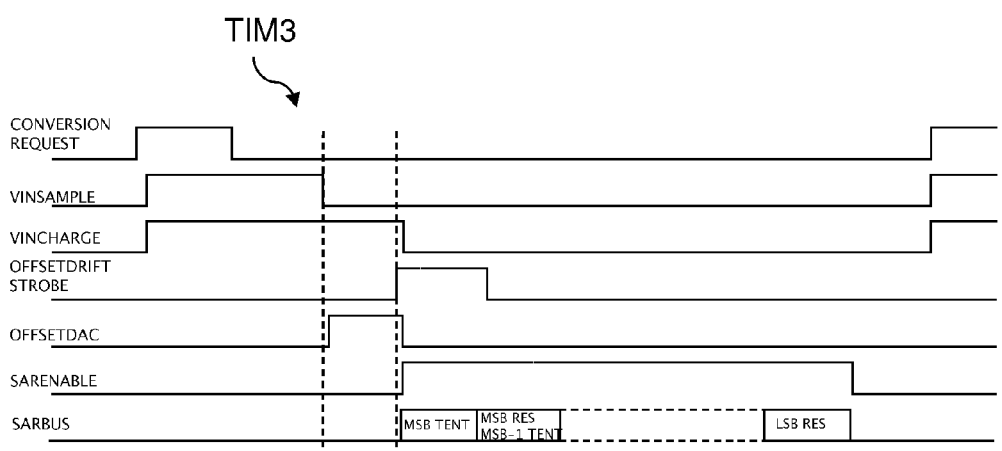
FIG. 7 shows the timing diagrams of the most relevant signals for the operation of the analog to digital converter of FIG. 6.

In some known applications, offset subtraction is not performed analogically at the input of capacitive DAC, but the offset free digital output code OUT-COD is obtained directly digitally subtracting the content of the offset register OFF-REG from the digital output code SARBUS; in the converter 10 of FIG. 6 with the time diagram TIM3 of FIG. 7 this case is faced, using the methodology of the converter 10 of FIG. 3. The digital output code SARBUS is compensated not only with the offset estimated digital value stored in offset register OFF-REG (as done in known art), but also with the digital value stored in the second up/down counter UDCOUNT2 that represents the offset drift. In more detail, the digital value resulting from the sum of the contents of the second up/down register UDCOUNT2 and offset register OFF-REG (called NEW OFFSET BUS) is sent to the capacitive DAC C-DAC (just like it was in the converter of FIG. 3), and also concurs with the SARBUS digital code in the determination of the offset corrected digital code OUT-COD.

OFFSET DAC signal, despite previously shown solutions, will remain active only for the time necessary to OFFSET-DRIFTSTROBE to sample the comparator value according to the timing diagram TIM3 (rising front). Since offset value is summed directly on SARBUS, OFFSET DAC signal will go back to 0, unlike previous cases, without the need of introducing an offset correction (neither nominal nor drift) in an analog way in the SAR evaluation. Being DAC of the offset value and of the SAR value performed not simultaneously, some capacitors of the DAC array can be shared following a known approach.

Figure 8:
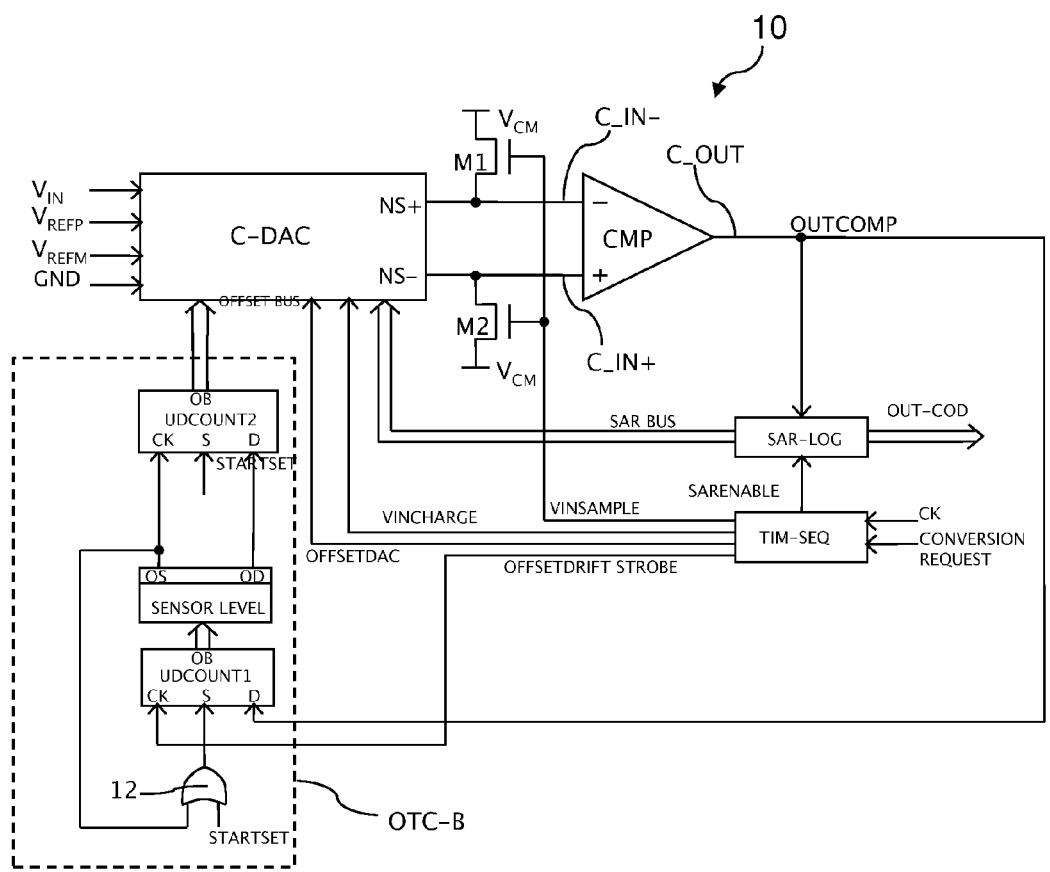
FIG. 8 shows a schematic diagram of a fourth embodiment of an analog to digital converter.

FIG. 8, which idea was exemplified according to the methodology of FIG. 3, allows to track and cancel the whole offset and not only its drift component: the up/down counter UDCOUNT2 can contain such data, given that it has a size that permits that; the system works just like explained when only the drift value was pursued, but now the target is the sum of nominal offset and offset drift. Of course, this kind of approach must be tolerable by the application of the converter, because during a transient tracking time the offset value would result different from the steady state.

Known approaches can be exploited to quickly reach a coarse value, in order to reduce the initial transient time.

All the described methods and converters (from FIG. 3 to FIG. 8) should not be considered limited to SAR converters applications. If it's possible to reserve some time for offset drift evaluation, once the system is understood, it's easily extended to Flash converters, with a couple of up/down counters UDCOUNT1, UDCOUNT2 for any comparator, as well as algorithmic converters or mixed approach converters.

For each of the disclosed methods and converters, the discretization of the correction (LSB of counter UDCOUNT2) could be less than the converter LSB, introducing a sub-lower array in the DAC, in a way known to a man skilled in the field.

The above disclosed methods and converters allow cancelling out the offset drift starting from an offset register, in which the offset nominal value is stored (for example during the power-up phase or through an OTP memory bank in which the value is stored with Automatic Test Equipment). If the specific application in which the converter/method is used permits to have a sufficient latent period at the beginning, it's possible to do without OTPs, since the embodiment of FIG. 8 cancels the whole offset: nominal value and drift. In modern converters, offset drift is becoming less and less acceptable: thanks to this embodiment it is possible to remove it, and, in the case it is possible to avoid OTPs, the savings in terms of area and testing costs are significant. Moreover, since one of the most used techniques of compensating offset relies on resetting the comparator first stage in feedback and storing the offset value on the DAC capacitors, this solution would result also in a faster reset time, because a common mode voltage $V_{CM}$ generated with a voltage divider can be exploited resulting in a significantly reduced settling time.

It is possible to observe the above disclosed methods can be said to be slow correction methods and they can tolerate higher offset drift values. Accordingly, it's possible to charge summing nodes NS+, NS− to a differently generated $V_{CM}$ voltage, thus reducing significantly the input voltage $V_{IN}$ sampling time, nevertheless correcting also other above mentioned offset variations.

It should be observed that the above description, given for different and non-limiting embodiments of the analog to digital converter 10, corresponds to the general description of an analog to digital converter 10 comprising:

a sampling section comprising at least a first array of switched capacitors having one end connected to a first common node NS+, NS—, said sampling section comprising an input adapted to receive an analog signal $V_{IN}$ to be converted into an output digital code OUT-COD;

at least one analog voltage comparator (CMP) comprising a first input C_IN− connected to the common node, a second input C_IN+ and an output C_OUT, said comparator being adapted to provide at said output C_OUT an output signal OUTCOMP having two levels based on the comparison of analog voltage values provided at said inputs C_IN−, C_IN+;

a control circuit TIM-SEQ, M1, M2 adapted to selectively force the first input of the comparator CMP to a predetermined voltage value $V_{CM}$;

a digital offset tracking and correcting block OTC-B adapted to receive said output signal OUTCOMP provided by the comparator CMP, said digital offset tracking and correcting circuit OTC-B comprising a circuit OFFSET REGISTER, UDCOUNT2 adapted to store one offset digital value representing an estimation of a voltage offset at said first common node NS+, NS−. In the above converter 10:

the sampling section is configured for sampling said analog signal $V_{IN}$ during a sampling interval VINCHARGE in order to obtain a sampled voltage value;

the control circuit TIM-SEQ, M1, M2 is adapted to force the first input of the comparator CMP to a predetermined voltage value during a first time period VINSAMPLE which is a portion of said sampling interval VINCHARGE ending before the end of said sampling interval VINCHARGE.

In the above converter 10, the digital offset tracking and correcting block OTC-B and said sampling section are configured, after the end of said first time period VINSAMPLE and before the end of said sampling interval period VINCHARGE, for injecting a charge amount into or pulling a charge amount from said first common node NS+, NS−. Said charge amount depends on said at least one stored offset digital value and said digital offset tracking and correcting block (OTC-B) is adapted to sample said output signal (OUTCOMP) for increasing or decreasing a digital value stored in first digital counter UDCOUNT1 based on the level of said sampled output signal and to correct or leave unchanged said at least one stored offset digital value based on the content of said first digital counter UDCOUNT1.

According to a possible and not limiting embodiment the sampling section, and in particular in the examples shown in the figures the digital to analog conversion block C-DAC, is designed according to general disclosure of in EP 1887702 B1.

According to an embodiment, said predetermined voltage value is a common mode voltage $V_{CM}$ of said comparator CMP. More preferably said predetermined voltage value $V_{CM}$ is set to be equal to the input common mode voltage of said comparator CMP. This embodiment is different from the examples disclosed in EP 1887702 B1 because in the patent during the sampling phase the summing nodes are connected to the output common mode voltage of the comparator.

According to a further embodiment, the digital offset tracking circuit OTC-B is configured for comparing said digital value stored in first digital counter UDCOUNT1 with one or more threshold values and correct or leave unchanged said at least one stored offset digital value based on the result of said comparison.

According to an embodiment, said comparator CMP is a differential comparator wherein the above mentioned first input is the inverting input C_IN− of the comparator and the above mentioned second input is the non-inverting input C_IN+ of the comparator. Said comparator CMP is adapted to provide at said output C_OUT said output signal OUTCOMP having two levels based on the comparison of voltage values provided respectively at the inverting input C_IN− and the non-inverting input C_IN+. The sampling section is adapted to sample said analog signal in order to obtain two differential analog voltage components of the sampled analog signal. In said embodiment, the control circuit TIM-SEQ, M1, M2 is adapted to force the inverting input C_IN− and the non-inverting input C_IN+ of the voltage comparator to said predetermined voltage value $V_{CM}$.

Figure 9:
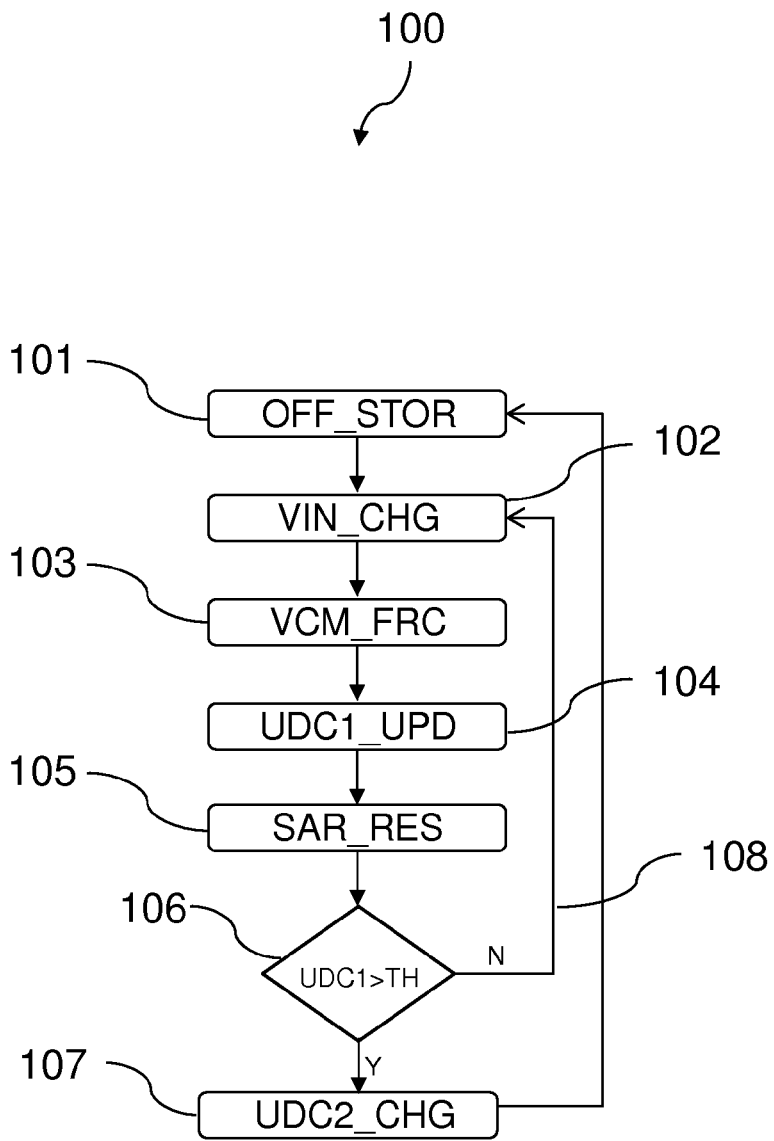
FIG. 9 shows a schematic flowchart of an analog to digital conversion method that can be performed by the analog to digital converters of FIGS. 3, 5, 6 and 8.

With reference to FIG. 9, it should be observed that the above description, given for different and non-limiting embodiments of the analog to digital converter 10, corresponds to the general description of a method 100 of converting an analog signal ($V_{IN}$) into a digital output code OUT-COD using an analog to digital converter 10 comprising:

a sampling section C-DAC comprising at least a first array of switched capacitors having one end connected to a first common node NS+, NS−; and at least one analog voltage comparator CMP comprising a first input C_IN− connected to the common node NS+, NS−, a second input C_IN+ and an output C_OUT, said comparator CMP being adapted to provide at said output C_OUT a signal OUTCOMP having two levels based on the comparison of analog voltage values provided at said inputs C_IN−, C_IN+.

With reference to FIG. 9, the method 100 comprising the steps of:

a) storing 101 "OFF_STOR" at least one offset digital value representing an estimation or a measure of a voltage offset at the first common node NS+, NS−;

b) providing 102 "VIN_CHG" the input analog signal $V_{IN}$ to the sampling section C-DAC and sampling said analog signal $V_{IN}$ during a sampling interval VINCHARGE (in the example shown in the figures the sampling interval corresponds to the time period in which the level of VINCHARGE is high) in order to obtain a sampled voltage value;

c) forcing 103 "VCM_FRC" the first input of the comparator CMP to a predetermined voltage value $V_{CM}$ during a first time period VINSAMPLE (in the example shown in the figures the sampling interval corresponds to the time period in which the level of VINSAMPLE is high) which is a portion of said sampling interval VINCHARGE ending before the end of said sampling interval VINCHARGE;

d) after the end of said first time period VINSAMPLE and before the end of the sampling interval period VINCHARGE, injecting 104 "UDC1_UPD" a charge amount into or pulling a charge amount from said first common node NS+, NS−, said charge amount depending on said at least one stored offset digital value, sampling said output signal OUTCOMP and increasing or decreasing a digital value stored in first digital counter UDCOUNT1 based on the level of said sampled output signal OUTCOMP;

e) at the end of said sampling interval VINCHARGE, sampling 105 "SAR_RES" said output signal OUTCOMP and obtaining one or more bits of said digital output code OUT-COD based on the level of said sampled output signal OUTCOMP;

f) repeatedly performing steps from b) to e) (in other words steps from 102 to 105 in FIG. 9);

g) correcting 107 "UDC2_CHG" or leaving unchanged 108 said at least one stored offset digital value based on the content of said first digital counter UDCOUNT1.

According to an embodiment, the predetermined voltage value $V_{CM}$ of the forcing 103 step "VCM_FRC" is a common mode voltage of said comparator CMP, preferably the input common mode thereof.

According to a further embodiment, the method further comprises a step of comparing 106 "UDC1>TH" the digital value stored in the first digital counter UDCOUNT1 with a threshold and wherein said correcting 107 or leaving unchanged 108 step depends on the result of said comparing step 106.

According to the embodiment of the method 100 adapted to be implemented by the analog to digital converter of FIG. 8, in the storing step 101 "OFF_STOR" said at least one stored offset digital value is a single value stored in a counter UDCOUNT2.

According to an alternative an embodiment of the method 100 adapted to be implemented by the analog to digital converters of FIGS. 1, 3 and 5 said at least one stored offset digital value comprises a first value and a second value. The storing step 101 "OFF_STOR" comprises storing said first value in a register OFF-REG and storing said second value in a digital counter UDCOUNT2. The correcting step 107 is performed on said second value stored in the digital counter 102. According to a more particular embodiment, the charge amount injected or pulled in said injecting step 104 "UDC1_UPD" depends on the sum between the first and the second value.

According to an embodiment, the method 100 is performed by a SAR converter 10 and the above mentioned sampling section comprises a digital to analog converter C-DAC.

According to a further embodiment of the method 100, that can be for example performed through the converter shown in FIG. 6, the injecting step 104 "UDC1_UPD" is performed during a second time period OFFSETDAC which ends before the beginning of the sampling step 102. In such embodiment the method 100 further comprises a step of subtracting at the end of said sampling step 102 from said output digital code said stored at least one offset digital value thus obtaining an offset corrected digital output code. According to an alternative embodiment of the method 100, that can be for example performed through the converters of FIGS. 3, 5 and 8, wherein the injecting step 104 is performed during a second time period OFFSETDAC which ends at the end of said sampling step 102 so that said injecting step 104 comprises an analog subtraction of said estimation of the voltage offset from the input analog signal.

The invention claimed is:

1. A method of converting an analog signal into a digital output code using an analog to digital converter comprising:
    a sampling section comprising at least a first array of switched capacitors having one end connected to a first common node; and
    at least one analog voltage comparator comprising a first input connected to the common node, a second input and an output, said comparator being adapted to provide at said output a signal having two levels based on the comparison of analog voltage values provided at said inputs;
    the method comprising the steps of:
        a) storing at least one offset digital value representing an estimation or a measure of a voltage offset at said first common node;
        b) providing the analog signal to the sampling section and sampling said analog signal during a sampling interval in order to obtain a sampled voltage value;
        c) forcing the first input of the comparator to a predetermined voltage value during a first time period which is a portion of said sampling interval ending before the end of said sampling interval;
        d) after the end of said first time period and before the end of said sampling interval period, injecting a charge amount into or pulling a charge amount from said first common node, said charge amount depending on said at least one stored offset digital value, sampling said output signal and increasing or decreasing a digital value stored in first digital counter based on the level of said sampled output signal;
        e) at the end of said sampling interval, sampling said output signal and obtaining one or more bits of said digital output code based on the level of said sampled output signal;
        f) repeatedly performing steps b)-e); and
        g) correcting or leaving unchanged said at least one stored offset digital value based on the content of said first digital counter.

2. A method of converting an analog signal into a digital signal according to claim 1, wherein said predetermined voltage value is a common mode voltage of said comparator.

3. A method of converting an analog signal into a digital signal according to claim 1, comprising a step of comparing said digital value stored in the first digital counter with a threshold and wherein said correcting or leaving unchanged step depends on the result of said comparing step.

4. A method of converting an analog signal into a digital signal according to claim 1, wherein in said storing step said at least one stored offset digital value is a single value stored in a counter.

5. A method of converting an analog signal into a digital signal according to claim 1, wherein said at least one stored offset digital value comprises a first value and a second value, and wherein said storing step a) comprises storing said first value in a register and storing said second value in a digital counter and wherein correcting step is performed on said second stored value.

6. A method of converting an analog signal into a digital signal according to claim 5, wherein said charge amount depends on the sum between the first and the second value.

7. A method of converting an analog signal into a digital signal according to claim 1, wherein said analog to digital converter is a SAR converter and wherein said sampling section comprises a digital to analog converter.

8. A method of converting an analog signal into a digital signal according to claim 1, wherein said injecting step d) is performed during a second time period which ends before the beginning of said sampling step e), and wherein the method further comprises a step of subtracting at the end of said sampling step e) from said output digital code said stored at least one offset digital value thus obtaining an offset corrected digital output code.

9. A method of converting an analog signal into a digital signal according to claim 1, wherein said injecting step d) is performed during a second time period which ends at the end of said sampling step e) so that said injecting step d) comprises an analog subtraction of said estimation of the voltage offset from said analog signal.

10. An analog to digital converter comprising:
    a sampling section comprising at least a frist array of switched capacitors having one end connected to a first common node said sampling section comprising an input adapted to receive an analog signal to be converted into an output digital code;
    at least one analog voltage comparator comprising a first input connected to the common node, a second input and an output, said comparator being adapted to provide at said output an output signal having two levels based on the comparison of analog voltage values provided at said inputs;
    a control circuit adapted to selectively force the first input of the comparator to a predetermined voltage value; and
    a digital offset tracking and correcting block adapted to receive said output signal provided by the comparator, said digital offset tracking and correcting circuit comprising a circuit adapted to store one offset digital value representing an estimation of a voltage offset at said first common node; wherein:

said sampling section is configured for sampling said analog signal during a sampling interval in order to obtain a sampled voltage value;

the control circuit is adapted to force the first input of the comparator to a predetermined voltage value during a first time period which is a portion of said sampling interval ending before the end of said sampling interval; and wherein said digital offset tracking and correcting block and said sampling section are configured, after the end of said first time period and before the end of said sampling interval period, for injecting a charge amount into or pulling a charge amount from said first common node, said charge amount depending on said at least one stored offset digital value and wherein said digital offset tracking and correcting block is adapted to sample said output signal for increasing or decreasing a digital value stored in first digital counter based on the level of said sampled output signal and to correct or leave unchanged said at least one stored offset digital value based on the content of said first digital counter.

11. An analog to digital converter according to claim 10, wherein said predetermined voltage value is a common mode voltage of said comparator.

12. An analog to digital converter according to claim 10, wherein said digital offset tracking and correcting block is configured for comparing said digital value with one or more threshold values and correct or leave unchanged said at least one stored offset digital value based on the result of said comparison.

13. An analog to digital converter according to claim 10, wherein:

said comparator is a differential comparator and wherein the first input is an inverting input, the second input is a non-inverting input, said comparator being adapted to provide at said output said output signal having two levels based on the comparison of voltage values provided respectively at the inverting input and the non-inverting input;

said sampling section is adapted to sample said analog signal in order to obtain two differential analog voltage components of the sampled analog signal; and said control circuit is adapted to force the inverting input and the non-inverting input of the voltage comparator to said predetermined voltage value.

* * * * *